(12) United States Patent
Connor (10) Patent No.: US 7,642,450 B2
(45) Date of Patent: Jan. 5, 2010

(54) COLLECTOR FOR SOLAR RADIATION

(75) Inventor: Philip Michael Connor, Mount Kuring-Gai (AU)

(73) Assignee: Sunengy Pty Limited (AU)

( * ) Notice: Subject to any disclaimer, the term of this patent is extended or adjusted under 35 U.S.C. 154(b) by 569 days.

(21) Appl. No.: 10/558,499

(22) PCT Filed: May 27, 2004

(86) PCT No.: PCT/AU2004/000699

§ 371 (c)(1),
(2), (4) Date: Nov. 28, 2005

(87) PCT Pub. No.: WO2004/106817

PCT Pub. Date: Dec. 9, 2004

(65) Prior Publication Data

US 2006/0260605 A1 Nov. 23, 2006

(30) Foreign Application Priority Data

May 29, 2003 (AU) .............................. 2003902656

(51) Int. Cl.
*F24J 2/12* (2006.01)
*H02N 6/00* (2006.01)
(52) U.S. Cl. ........................ 136/246; 126/573; 126/576; 126/600; 126/605; 126/698
(58) Field of Classification Search ................. 136/243, 136/246; 126/573, 576, 600, 605, 698
See application file for complete search history.

(56) References Cited

U.S. PATENT DOCUMENTS

| | | | | |
|---|---|---|---|---|
| 2,460,482 | A * | 2/1949 | Abbot | 126/605 |
| 4,052,228 | A * | 10/1977 | Russell | 136/246 |
| 4,127,103 | A * | 11/1978 | Klank et al. | 126/643 |
| 4,143,233 | A * | 3/1979 | Kapany et al. | 136/259 |
| 4,421,104 | A * | 12/1983 | Adcock | 126/600 |
| 4,473,065 | A * | 9/1984 | Bates | 126/635 |
| 4,549,528 | A * | 10/1985 | Gibson | 588/306 |
| 5,309,893 | A | 5/1994 | Yeomans | |
| 6,220,241 | B1 * | 4/2001 | Yeomans | 126/565 |
| 6,619,282 | B1 | 9/2003 | Muthra | |

FOREIGN PATENT DOCUMENTS

| | | |
|---|---|---|
| SU | 1 315 754 | 6/1987 |
| WO | WO 03/032404 A1 * | 4/2003 |
| WO | WO 03/034506 A2 * | 4/2003 |

* cited by examiner

*Primary Examiner*—Rodney G McDonald
(74) *Attorney, Agent, or Firm*—Craig A. Fieschko, Esq.; DeWitt Ross & Stevens S.C.

(57) ABSTRACT

A solar collector arrangement includes a number of assemblies (1), which are immersed or partially immersed in a pond of water (2). Each assembly (1) includes a parabolic reflector (3) and an absorber (6). Barriers (10) are located on or near the surface of the water (2) and operate to reduce waves which may otherwise disturb the direct passage of sunlight in windy conditions. The complete immersion of the assembly (1) in the liquid serves to simultaneously protect and cool the apparatus, while allowing ease of sun 10 tracking movements by buoyancy induced rotation. Partially immersed versions have higher efficiency and protect against severe weather by inverting into the water.

24 Claims, 6 Drawing Sheets

COLLECTOR FOR SOLAR RADIATION

TECHNICAL FIELD

The present invention relates to the tracking and protection of solar energy collectors and the like.

BACKGROUND ART

There is a need to economically collect solar energy in concentrated form prior to direct use or conversion to electricity or other useable forms of energy. Solar energy has a modest intensity at the earth's surface of about 1000 Watts per square meter.

It is thus highly desirable to concentrate the energy to higher intensity (usually expressed in Watts per square meter, or $W/m^2$) before use. This is particularly so where solar cells are used to convert the solar energy into electrical energy. The photovoltaic cells that are used to convert the solar energy into electrical energy are relatively expensive. Concentration of the incident solar energy into a smaller area allows the use of a smaller area of energy conversion cells, with lower resulting costs of conversion cells. The key requirement in a concentrating collector is a means to concentrate the energy as much as possible with a system which is very low in cost per unit area and which can track the sun by rotation about one or two axes.

In the past, various forms of concentrator have been used. These have included refractive concentrators (lenses) and, more commonly, curved reflectors (mirrors). The concentrators are generally mounted on structures that allow movement to follow or track the movement of the sun accurately across the sky each day. For economy the system used to track the sun must be as simple and robust as possible. Present methods of tracking use either motors and gears, or sliding hydraulic actuators, both of which add considerable cost. The need for tracking makes the concentrator structures heavier and more complex than static non-concentrating solar energy collectors, because the tracking movements usually require that all support be provided through rotary joints which are subject to very high forces during extreme winds.

Any structures used for concentration must be well protected from high winds, hail and other aspects of extreme weather conditions. It is also most commonly desirable to provide some form of cooling of the devices that convert the concentrated solar energy to electricity.

Silicon photovoltaic cells, which are the most economical variety at this point in time, operate less efficiently as their temperature increases. If a mechanism for cooling the cells is not used, the use of concentrators tends to cause the cells to operate at higher temperature, decreasing their energy conversion efficiency.

Most concentrators designed so far employ very substantial mechanical structures to resist movement and damage from the wind. In addition they usually employ heavy and strong materials such as glass with metal backing for the reflective element to protect the device from damage by wind, ice and hail. Such structures are, at present, either very expensive or too fragile for continuous outdoor use.

One method that has been used to protect the reflective concentrator surface has been the use of an inflatable, aluminised, flexible plastic membrane as a concentrating reflector. The shape of the membrane is maintained by an air pressure difference from one side to the other. Such reflectors can be deflated during severe weather. They are relatively cheap, but are still subject to damage from high winds and by ultraviolet light. In addition they require substantial structures to support the moving parts against high winds.

Another method that has been used to protect concentrators is the use of a transparent dome or building to cover and protect the whole solar concentrator. This does allow some simplification of the structural design of the moving concentrator. However, this method has little or no overall cost advantage due to the added cost of the protective structure.

The Yeomans patents WO93/09390 and U.S. Pat. No. 6,220,241 B1 use temporary immersion in water to protect a reflective concentrator. It consists of a reflective concentrator floating on water with a heat collector at the focal point in the air above. The concentrator can be submerged using pumps for limited periods to avoid damage to the concentrator mirror during adverse weather conditions. This is achieved by flooding its' buoyancy tanks with water, a change in the absolute buoyancy of the apparatus. It is not able to operate as a solar concentrator or energy collector while submerged. The concentrator may still be damaged in bad weather if the mechanism fails or loses power at a critical time (it is not passively robust). This system also achieves tracking movement in an azimuth direction (rotation about the vertical axis only), using movement within the water. Tracking about a horizontal axis is achieved via motors, gears and levers.

Virtually all the existing concentrating collectors require the mechanism to move to a special protected position for protection against adverse weather, making them particularly vulnerable to damage when there is a mechanical or electrical breakdown.

Russian patent number SU1430-927-A to Novorossiisk Naval describes the general concept of floating a flexible transparent sack in water to create a lens, but no details are given of the material to fill this sack, or of any energy collector or conversion device, or of the scale of the device and no tracking method is proposed.

Aims

The present invention accordingly aims to provide protection against weather conditions and ultraviolet radiation for solar concentrators and collectors. Subsidiary aims of the present invention are, to provide a simple means for tracking solar concentrators to follow the sun and to provide cooling for solar collectors, and to provide more lightweight structures than was previously possible. The invention addresses these aims, at least in part, by using the protective, cooling and buoyancy properties of a body of liquid, such as a lagoon, pond, tank, lake, dam or the like of water or other liquid.

SUMMARY OF THE INVENTION

The present invention accordingly provides a collector for the collection of solar radiation, which collector includes:
at least one energy conversion device for the conversion of electromagnetic energy into another form of energy; and
at least one concentration device for the reception of electromagnetic energy and the concentration of it onto the energy conversion device in which both devices are at least partially immersed during operation within the same body of liquid.

It is preferred that the liquid is water.

In one preferred form of the collector, the conversion device includes a photovoltaic cell. In this embodiment of the invention, the photovoltaic cell is encased in a hermetic seal.

In an alternative preferred form of the invention, the energy conversion device includes a component that converts incident electromagnetic energy into heat; and which is enclosed by a vacuum chamber.

In an alternative preferred form of the invention, the energy conversion device includes a component which converts incident electromagnetic energy into stored chemical energy via a photochemical reactor using Titanium Dioxide or other photo-catalyst which may split water into hydrogen and oxygen or enhance other useful chemical processes.

One preferred form of the concentration device includes a mirror. An alternative preferred form of concentration device includes a lens.

It is preferred that the concentration device is fabricated at least in part from plastics material.

It is preferred that the collector be provided with at least two interconnected and vertically extended lateral buoyancy tanks on opposite sides with the total buoyancy being set constant and sufficient to keep the whole unit substantially below the water surface, but with positive buoyancy so that the unit floats just below the surface. It is preferred that the relative buoyancy of these two tanks should be adjusted by interchange of liquid and air between them to cause the collector to rotate about the horizontal axis perpendicular to the line between the two tanks to provide simple tracking of the direction of incoming solar radiation. These two interconnected buoyancy tanks can be implemented in the form of a curved tube whose sealed ends are below the water surface with the curve of the tube rising above the surface. Using this method the net or total buoyancy of the apparatus does not change. The total buoyancy is kept constant, with the tanks sealed to the outside air and water, but the relative buoyancy of the pair is adjustable. In this embodiment the concentrator is suspended under the water from floats at the surface, so that there is no need for a substantial support structure mounted at the bottom of the pond, and no need to control the depth of the water precisely, and no need for any bearings or rotating joints.

It is preferred that the collector includes means to inhibit the formation of waves at the interface between the body of liquid and the air. It is especially preferred that the means for inhibiting the formation of waves is substantially transparent to the solar radiation.

It is preferred that the liquid includes a component or additive to suppress the growth of algae and bacterial slime.

The invention accordingly addresses the aims of the invention, at least in part, by using the protective and buoyancy properties of a body of liquid, such as the sea, a pond, tank, dam, lake or the like of water or the like.

Figure 1:
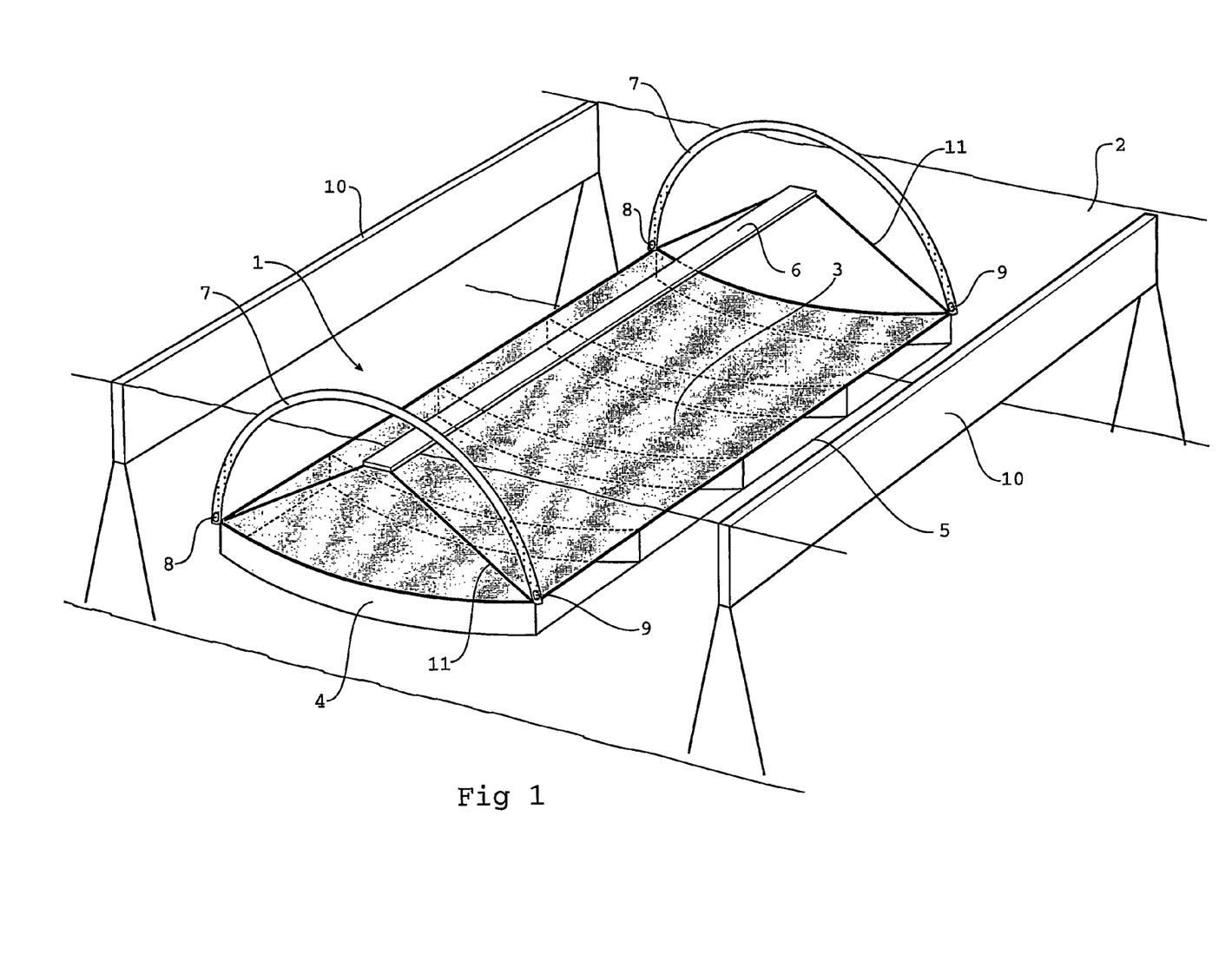
FIG. 1 is a perspective view of a portion of apparatus according to one embodiment of the present invention.
Figure 3:
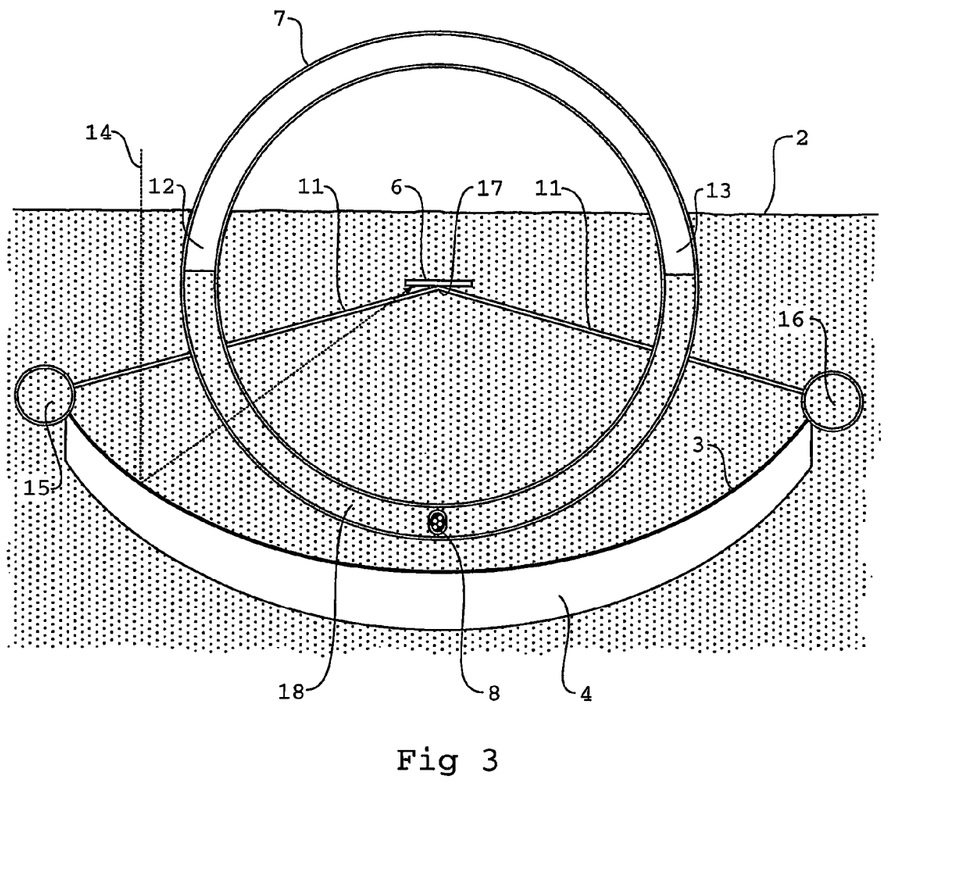
FIG. 3 is an elevation view of a portion of apparatus according to another embodiment of the present invention, similar to that of FIG. 1.
Figure 4:
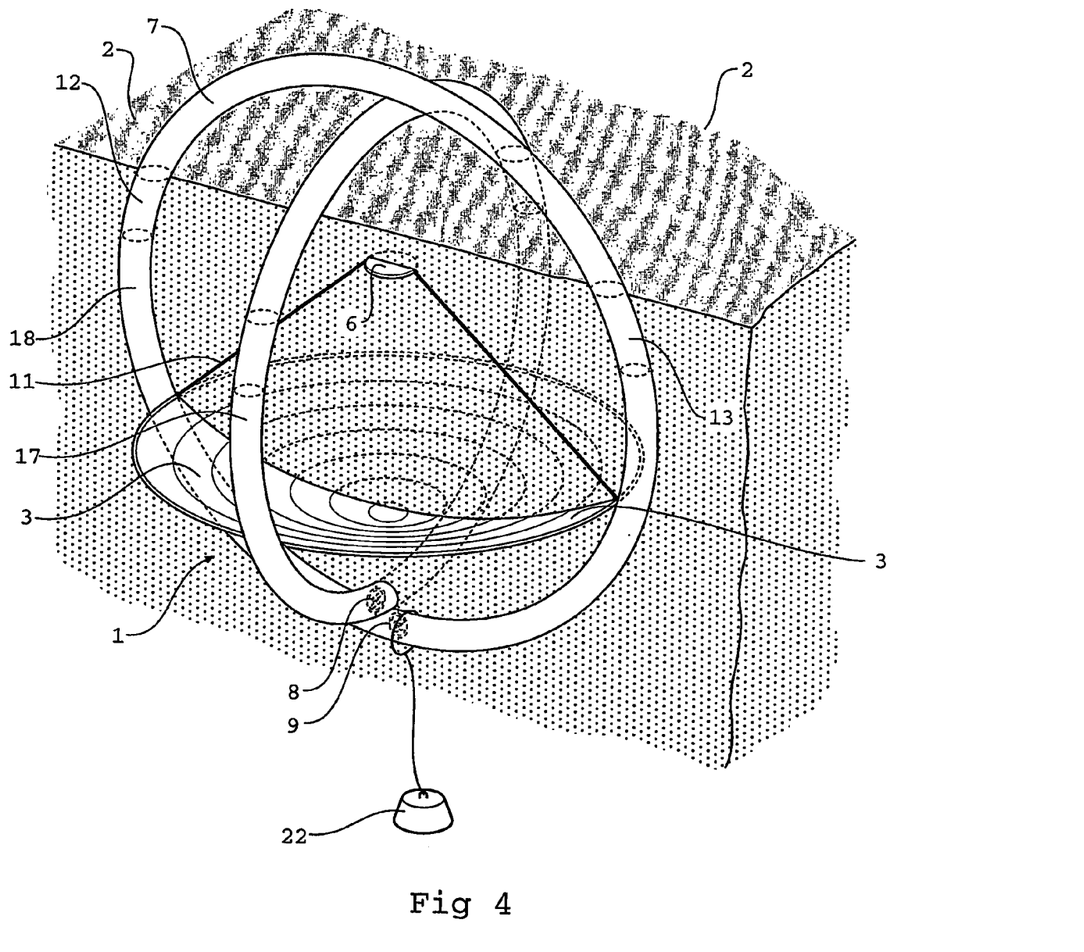
FIG. 4 is a perspective view of another embodiment of the present invention, using a point focus concentrator.
Figure 5:
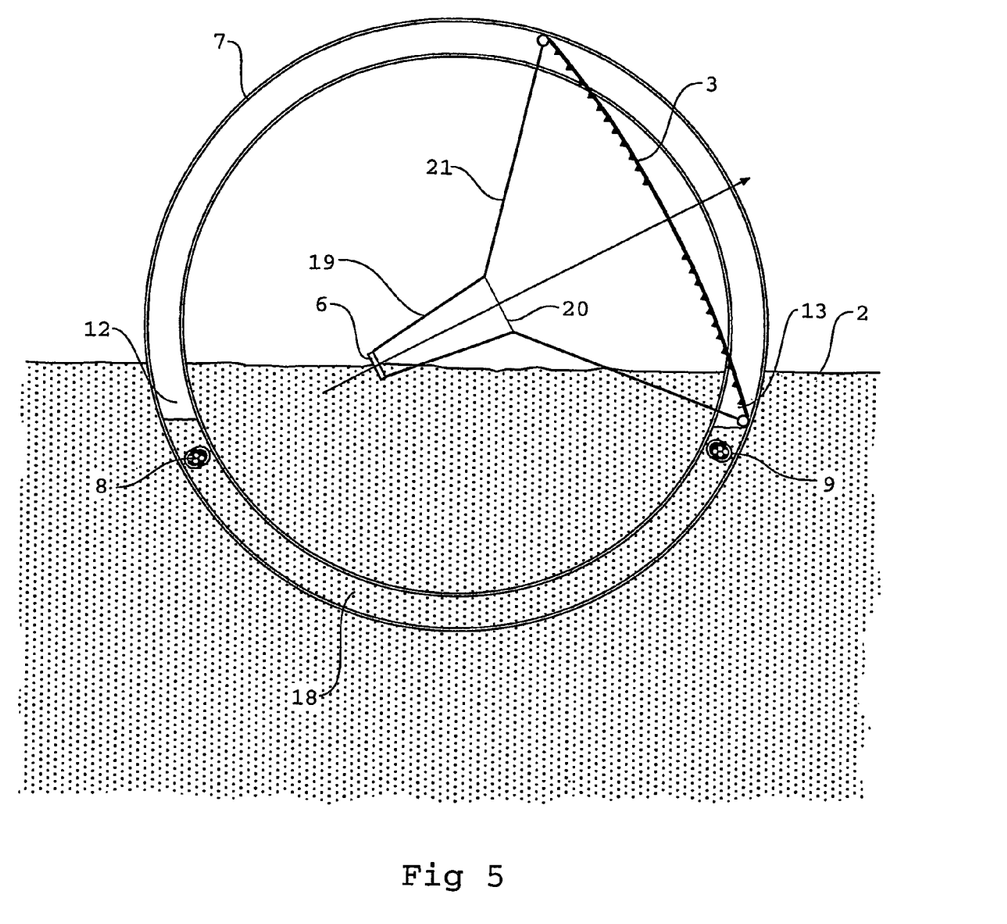
FIGS. 5 and 6 are elevation views of other embodiments of the present invention, wherein the concentrator is substantially above the water level during part of the operational cycle each day.
Figure 6:
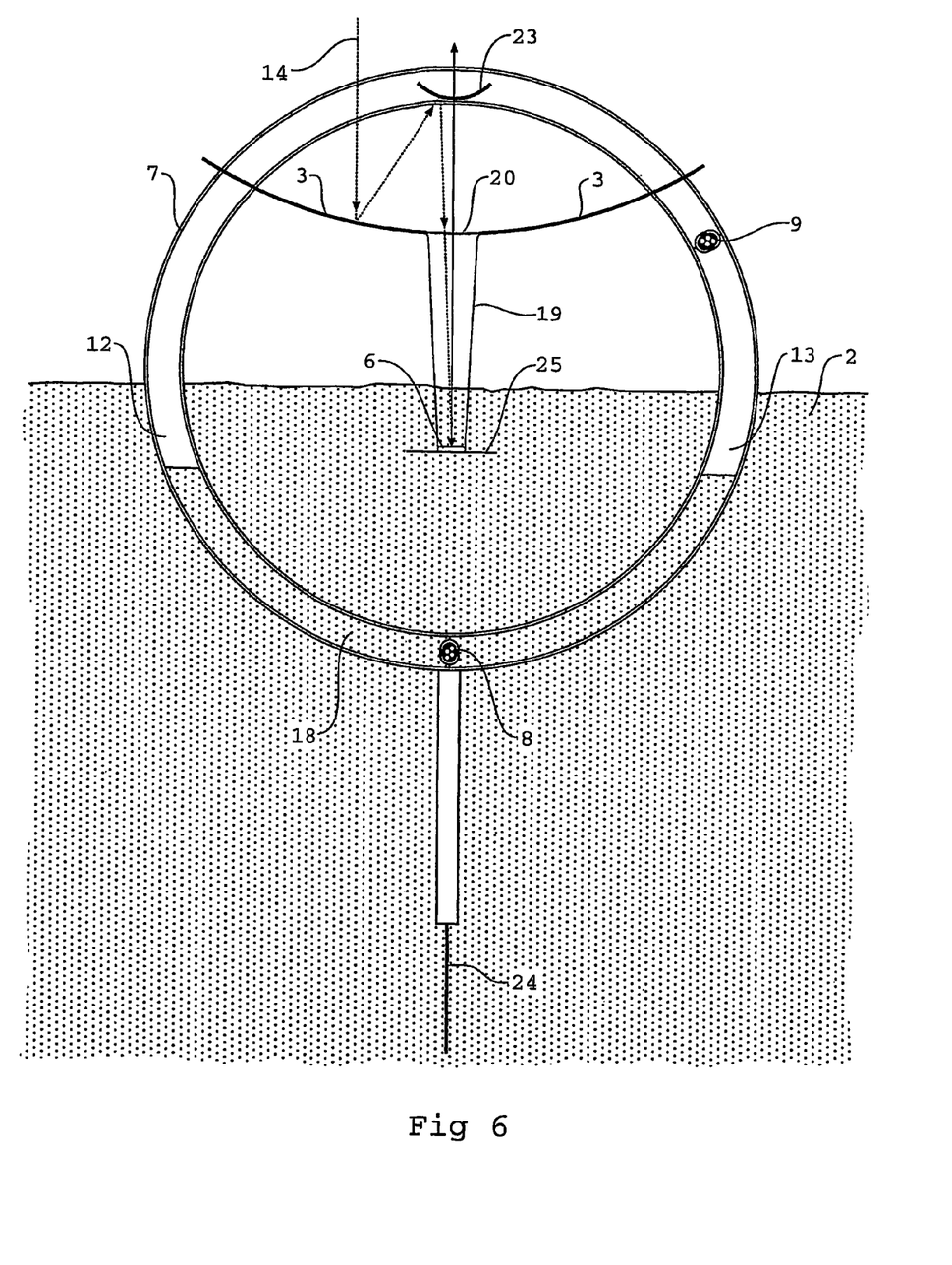

There are two principal varieties of the invention, the first being that where both concentrator and energy converter are permanently immersed, as illustrated in FIGS. 1 and 3 and 4, while the second principal variety, as illustrated in FIGS. 5 and 6, is that where the energy converter is substantially immersed during operation, but the concentrator is only partially immersed for part of the operating day, and may be fully immersed by rotating the tracking system to point the concentrator downwards.

The advantages of the first principal variety are that the continuous immersion of the concentrator passively protects it against weather at all times, that immersion allows the use of a simple lateral buoyancy balance to achieve tracking, and that PV cells are naturally cooled by immersion in a body of water.

The advantages of the second principal variety are that immersion allows protection of the concentrator when required by rotation of the buoyancy tracking system, and that partial immersion allows the use of a simple lateral buoyancy balance to achieve tracking of a short focal length system (which is the lightest and most stable system), and that PV cells are naturally cooled by immersion in a body of water. In addition, the second variety has little water in the optical path so that it produces more energy per unit area.

DESCRIPTION OF PREFERRED EMBODIMENTS OF THE INVENTION

According to the embodiment of the present invention which is illustrated by reference to FIG. 1, a plurality of assemblies, one of which is generally indicted by reference numeral 1, are immersed in a pond or other body of transparent liquid 2. It is preferred that the pond of liquid 2 be water.

The complete immersion of the assembly 1 in the liquid serves to simultaneously protect and cool the apparatus whilst allowing easy rotation about any axis through the center of gravity of the collector. The assembly is given slight positive buoyancy to keep it substantially below the surface, but touching the surface.

The solar collector assembly includes a reflector that is generally indicated at 3 (shaded in the diagram). In its preferred form, the reflector 3 has a reflecting surface which is substantially parabolic in a cross-section of the collector, and which extends longitudinally to form a generally trough-shaped reflecting surface.

Each reflector assembly 3 is constructed on a base of thin, rigid plastics material (preferably acrylic or polycarbonate) to which is added a metallic reflective layer. The reflective layer is then sealed from liquids with a transparent plastics cover layer such as polypropylene, acrylic, Mylar or other suitable material. Preferred forms of reflector material include aluminium, silver and rhodium. The parabolic shape is maintained by attaching a plurality of one dimensional parabolic formers 4 and straight interconnecting stringers 5 perpendicular to the rear of the reflective surface.

In one arrangement of the assembly shown in FIG. 1, the long axis of each trough reflector 3 runs in a generally North-South direction if the system is using east-west tracking (horizontal axis tracking). A linearly extending array of photovoltaic cells 6 is mounted at the focus of the reflector assembly 3, accordingly similarly running in a North-South direction. This North-South orientation is best suited to tropical regions with high sun angles all year. An alternative arrangement that better suits higher latitudes is North-South tracking of trough reflectors with their long axes aligned East-West. To allow horizontal axis (azumithal) sun tracking, the reflector assembly 3 is provided with a sealed buoyancy tank in the shape of a curved tube 7, which passes above the height of the photovoltaic cells 6. The buoyancy tank can be placed at one end of the assembly to avoid shading, with another buoyancy tank added to the other end of the assembly to provide balanced support. The total buoyancy of the assembly can be adjusted by adding a suitable amount of water or other fluid such as Ethylene Glycol to each of the tanks to give the whole assembly slight positive buoyancy, sufficient to bring the top edge of the curved buoyancy tube above the water while keeping the photovoltaic cells 6 just below the water surface 2. The remainder of each buoyancy tank and connecting tube is filled with air. Under these conditions the assembly can be rotated in the water about its' center of gravity by changing the relative lateral buoyancy without altering the total. This rotation is achieved by pumping small amounts of fluid from the right to left tank or vica-versa using very small sealed electrical pumps mounted within each buoyancy tank at 8 and 9. The delivery side of each pump is connected by a small tube (which is not shown in the diagram), to the opposite end of the curved tube 7 thus allowing movement of water to the opposite end when required. A single, reversible positive-displacement pump can be used as an alternative, as illustrated in FIG. 3. The pumps are switched by a simple automatic sun-tracking circuit controlled by a pair of photosensitive cells, which are mounted on each side of a shadow vane on the north-south focal axis of the system, thus aligning the whole assembly with the sun's rays. Such electronic servomechanisms are well known and not shown here. This rotational movement of the reflector assembly 3 about the center of gravity of the assembly allows tracking of the sun from East to West during the day. Since the rate of movement required is slow (less than 15° per hour) and the assembly is not exposed to wind, there are no significant forces acting on the assembly of FIG. 1 except the slight drag of the water. The rate of movement of the sun is 15° per hour, but the increase in refractive index that is encountered by the sunlight in entering the water reduces the actual angular rate of movement required in the collector slightly. If required, tracking can be achieved on two axes by the use of a second pair of buoyancy tanks at right angles to the first pair. In this embodiment the concentrator is suspended under the water from the air filled section of the buoyancy tracking tubes 7 at the surface, so that there is no need for a substantial support structure mounted at the bottom of the pond, and no need to control the depth of the water precisely.

A higher cost alternative (not shown in this illustration) which gives maximum performance at any latitude, is a system which provides two-axis tracking by allowing rotation around a vertical axis together with azimuthal tilt (horizontal axis tracking). Rotation about the vertical axis can be achieved through motor-driven propellers at a tangent to a circle in the plane of rotation or through a motor-driven paddle wheel with a vertical axis of rotation to provide horizontal tangential thrust. Such two axis tracking systems can use two dimensional (dish) concentrators.

When the concentrator system is fully immersed in water it is no longer necessary to employ strong or heavy materials for the reflector as the movements and pressures caused by wind and weather reduce very rapidly with depth in water. This allows the use of relatively lightweight structural materials such as plastics for almost all parts of the collector. In addition, the structural deflections caused by gravity are greatly reduced, since the densities of typical plastics employed in the structure are only around twenty percent higher than the surrounding water. Components are protected from most forms of environmental damage by immersion in water, including protection from high winds, hail, windblown dust and short wavelength UV light. Ultraviolet light damages many plastics. However, with the fully immersed form of the present invention, wavelengths below about 250 nanometers are filtered out by passage of the sunlight through water, so long as the passage through water is longer than about 50 cm. This allows longer-term use of cheaper forms of plastics materials, which would otherwise not be suitable for use when exposed directly to sunlight.

A linearly extending array of energy absorbing devices 6, preferably photovoltaic (PV) cells, is located at the focus of the reflector assembly 3, and is mounted to move in synchronism with the reflector assembly 3. It is preferred that the energy absorbing assembly 6 is mounted in place at the focus by a support assembly 11 (such as of clear plastics material) that mounts directly on the reflector assembly 3. When photovoltaic cells are used as energy absorbing devices, they are encased in a thin hermetic seal (preferably of a suitably transparent plastics material, such as Tedlar, or of glass) to prevent water damage to the semiconductor. This encasing material however must be of adequate conductivity to heat, to allow the cells to be cooled by the surrounding water. Any space remaining between the encasing material and the photovoltaic cells should be filled with a transparent non-corrosive liquid such as Silicone oil or with a transparent flexible solid such as silicone rubber. The surrounding water provides convective liquid cooling of the energy conversion device placed at the focus of the concentrator. According to further preferred embodiments of the invention (which are illustrated in FIG. 6), the photovoltaic cells or the like are mounted on a heat-conducting substrate. Preferred materials for this mounting substrate include copper, aluminium and alumina ceramics. It is especially preferred that that this mounting substrate also be encased with a thin layer of suitable plastics material (such as Tedlar) to form a hermetic seal if the surrounding liquid is corrosive to the substrate. Portions of the mounting substrate remote from the cells are in contact with the liquid, enhancing cooling of the cells. If necessary in a particular installation, further means are provided for enhancing transfer of heat from the substrate to the liquid. Preferred means of enhancing heat transfer include heat sinking fins attached to or integral with the substrate, and channels through the substrate which are in communication with the surrounding liquid.

If the sun's energy is to be absorbed as heat or for the purpose of driving a chemical process, rather than converted to electricity by photovoltaic cells, it is preferred that a transparent cylindrical vacuum chamber is provided at the reflector focus, surrounding the energy converter 6, to prevent water cooling of the absorber.

The depth of the liquid 2 in FIG. 1 that is required depends on the chosen width of the focal absorbing strip (PV cells), which is typically 10 mm to 50 mm. The reflector concentration ratio is typically 20 to 50, and this requires a trough width of about 1 m to 5 m for a 50 mm strip, or 200 mm to 500 mm for a 10 mm wide focal strip.

A parabolic reflector concentrator with a flat absorber generally needs a focal length of approximately one half of the aperture or a little more, so the focal length is in the range of 150 mm to 2.5 m. Thus the minimum water depth would be between 200 mm and 3 m, typically 1 m. Thus the reflector is typically one meter wide with a 20 mm wide focal strip, in a depth of water of about one meter.

There is significant attenuation of the longer wavelengths of the sunlight by the water. Experiments at one meter of optical path in clear water have determined that this results in a reduction of output from the present silicon photovoltaic cells to around 45% to 50% of their fully exposed levels. To compensate for this effect it is necessary to use larger reflector areas, but this does not greatly increase the overall capital cost since the reflector can be made of lightweight, low cost materials. If the PV cells are designed for optimal spectral response for the underwater application, these losses may be reduced. A suitable form of PV cell is that made from Indium Gallium Phosphide, which is very efficient in the visible light range using wavelengths from 400 to 700 nm. In addition, a shorter optical path length in the water will reduce losses, so the assembly should be kept as near the surface as possible.

The cost of the pond required for immersion of the collector assemblies 1 is not a large factor, since it is similar in structure to low cost water retaining dams, or may even be a natural pond or salt lake or a saltwater inlet or lagoon connected to the sea. Large arrays of collector assemblies can be employed in a single pond covering many thousands of square meters.

It is preferred that the pond of water is provided with regularly spaced fixed and/or floating barriers 10 (which are preferably transparent when they intercept light travelling to the concentrators). It is preferred that the refractive index of the barriers be close to that of the water, to minimise losses. These barriers are located on or near the surface and operate to reduce waves that may otherwise disturb the direct passage of sunlight in windy conditions. At least one such barrier 10 is placed between adjacent parallel rows of concentrator assemblies 1 with a typical spacing of 1.5 m. Cross-rows of barriers (which are not illustrated in the drawings) are also preferably placed at regular intervals at right angles to the rows of concentrators 1. It is preferred that the spacing between these cross-rows is about three to six meters.

Alternatively, or in addition, a thin layer of clear mineral oil or other suitable high viscosity transparent liquid can be provided to float on the surface of a lower liquid to reduce the build-up of surface waves.

Alternatively, or in addition, a thin transparent membrane or small-scale cell structure can be provided to float on the surface to reduce the build-up of surface waves.

To avoid the build up of algae and other organic contaminants on critical surfaces, the water of the pond preferably contains a suitable component or additive to suppress growth of algae. It is preferred that this component or additive be common sodium chloride (at 'Dead Sea' levels), other salt or other transparent chemical additive which kills algae used alone or in combination. Certain such additives, including sodium chloride, can additionally aid against freezing of the water. Other preferred additives to suppress algae growth include copper based algaecides, chlorination, and ozone or ultraviolet treatment of the water. Alternatively, or in addition, moving mechanical cleaners can be employed, which remove algae and bacteria with high velocity water jets, or suitable water snails, fish or other organisms may be employed to eat the contaminants.

Alternatively, algae and bacteria can be suppressed by raising the temperature of the pond water sufficiently high to kill such organisms periodically. This may be achieved by the incoming solar radiation alone when a transparent surface membrane is employed to cover nearly the whole pond.

Figure 2:
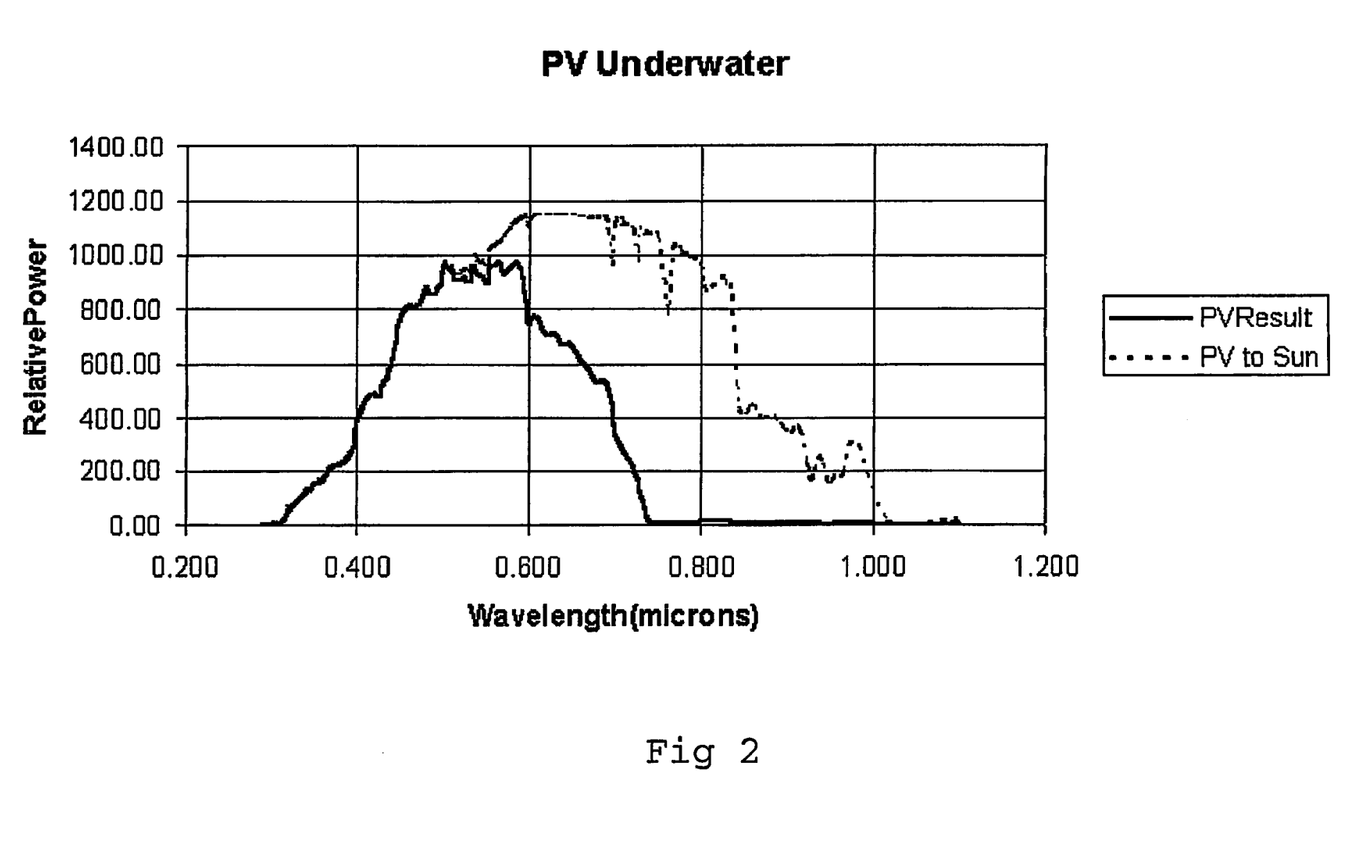
FIG. 2 is a chart illustrating the efficiency of light utilisation of one embodiment of the present invention.

FIG. 2 serves to illustrate the relative power available from a silicon photovoltaic cell after surface reflections at the upper surface of the water and passage of sunlight through two meters of water to the cell. This is an overall throughput of about 50% of the sunlight energy incident on the upper surface of the water which would normally be available to a Silicon PV cell.

Making the reflector assembly 3 of the concentrator larger readily compensates for the loss of efficiency caused by passage of the light through water. Since the cost of the reflector per unit area is very low (being made of lightweight plastics) compared to the cost of photovoltaic cells, this is not a significant cost. The area of photovoltaic cells required for a given power output is not changed by losses in transmission through water, but the reflector area must be increased relative to the area required for a normal concentrating collector in the air.

According to the alternative embodiment of the present invention which is illustrated by reference to FIG. 3, an assembly similar to FIG. 1 is show in elevation, or end view, substantially immersed in a body of water 2. The reference numbers used here and in subsequent Figures match those of FIG. 1 for corresponding elements. In this embodiment the photovoltaic cells 6 are kept close to the centre of rotation 17 and tanks 15 and 16 are used to prevent the reflector 3 from rising above the water surface at the most extreme rotations, and a single pump 8 is employed. In this embodiment a sealed hollow buoyancy tracking tube 7, approximately half filled with liquid 18, is employed with reversible, bidirectional positive displacement pump 8, to rotate the assembly as one unit about the centre of rotation 17 of the tracking tube loop 7. The preferred liquid in 7 is ethylene glycol or water and the remaining space in the tube is filled with air. The rotation is effected by movement of the liquid enclosed within 7 from left to right through the pump 8, or visa-versa, to change the left-right balance of the system via the resulting shift in the buoyant zones 12 and 13. The pump 8 is driven by an electric motor that is controlled in speed and direction by an electronic servo mechanism fed by left and right light sensors aligned with the vertical axis of the system. Such servo-mechanisms are well known and so are not illustrated here.

Tanks 15 and 16 are sealed tubes running the full length of the edges of the reflector which are thin walled and filled with water to be of approximately neutral buoyancy when submerged. At extreme tilt to the left (counterclockwise), tank 16 will rise to the surface. As 16 breaks the surface the mass of water contained in 16 tends to prevent the corresponding reflector edge from rising out of the water. Instead the remainder of the assembly will move deeper into the water as the system rotates further counterclockwise, allowing tracking of the sun to more extreme angles while maintaining energy collection from the whole surface of the reflector 3. A similar action occurs on clockwise movement when tank 15 rises to the surface. This embodiment, using 15 and 16, allows the reflector to be kept, on average, closer to the surface than would otherwise be possible, thus reducing the losses due to the length of the optical path through the water medium.

According to the alternative embodiment of the present invention which is illustrated in perspective by reference to FIG. 4, the apparatus uses a point focus or two dimensional parabolic concentrator 3 with a pair of near circular buoyancy tracking tube loops 7 and 17 mounted vertically and at right angles to each other to provide full tracking of the sun in two dimensions. An array of photovoltaic cells 6 is mounted near the focus of the substantially parabolic reflecting concentrator 3. The components are mounted to move as one unit. The assembly is kept substantially underwater by adding sufficient liquid 18 to sealed tubes 7 and 17, the balance of the upper section of each tube being filled with air or inert gas. The preferred liquid 18 is ethylene glycol or water. The lowest point of each of tubes 7 and 17 contains a positive displacement pump 8 or 9 controlling movement of liquid between the lower sections of each of the tubes 7 and 17. There is no communication of liquid between the tubes 7 and 17 and each tube is sealed. Thus the relative lateral buoyancy of each of the tubes can be adjusted by pump 8 and 9 to rotate each tube in relation the water surface about an axis perpendicular to the plane of each tube. These pumps are controlled by a pair of photocells and servomechanism for each axis, as described for the earlier embodiments. Since the tracking system will maintain pointing of the assembly at the brightest point in the sky at all times, it is not necessary to orient the system to North/South. To keep the assembly in one location and provide a path for the power wiring, it is desirable to have a flexible anchor rope and anchorage 22 to the bottom of the pond. A typical size for the round parabolic reflector 3 in this system is about one meter diameter.

The embodiment shown in FIG. 4 has advantages over the method of FIG. 1 in that this embodiment uses two dimensional concentration which allows lower focussing accuracy on each axis for a given level of concentration. Thus it is more tolerant of waves and ripples and less precise manufacturing methods may be required for the reflector 3.

FIGS. 5 and 6 are preferred embodiments of the second principal variety of the invention where the concentrator is not permanently immersed, but moves partially into the water during tracking rotations and fully into the water when rotated 180 degrees from the zenith.

According to the alternative embodiment of the present invention which is illustrated in plan view by reference to FIG. 5, the apparatus uses a refractive Fresnel lens 3, preferably made of transparent plastics material, joined as shown to a buoyancy tracking loop tube 7 (or a pair of such tubes at right angles for a two dimensional tracking concentrator, similar to that in FIG. 4) and Photovoltaic energy converters 6, similar to those described for previous embodiments. The numbers used match those of previous Figures for corresponding components. In this embodiment the apparatus is only partially submerged, such that, while the PV cells 6 are always submerged, the Fresnel lens 3 is above the water surface 2 for about half of the tracking tube 7 rotation. FIG. 5 shows the apparatus oriented to point about 30 degrees above the horizon. As previously described, the tracking tube 7 contains a positive displacement pump 8 which moves fluid 18 within the lower section of tube 7 to set the position of buoyant zones 12 and 13 which position the rotation of the collector system to track the angle of the sun's rays (which enter along the axis indicated by the arrow). During extreme weather conditions extra protection can be provided by providing a further positive displacement pump 9 within tube 7 at a suitable position as shown to allow the tracking system to almost fully invert the collector, immersing the concentrator and thus greatly reducing the area of the exposed section and reducing wind loads. The pumps 8 and 9 are spaced approximately 120 degrees apart. With the components positioned as shown in FIG. 5 the collector is able to track the sun over at least 120 degrees, corresponding to 8 hours of the sun's movement. A third pump 120 degrees away from 8 and 9 can be optionally employed to provide full rotational capability. Component 19 is a slightly conical tube whose inner surface is highly reflective (Aluminised), channeling light from lens 3 to the PV cells 6 and acting as a secondary concentrator which further focuses the light. Tube 19 can also act to even out the variations in the focussed light by multiple reflections, allowing more efficient operation of the PV cells 6. The walls of 19, together with transparent window 20 and enclosure of PV cells 6, make a sealed enclosure which prevents dirt or water contamination of the PV cells. The walls of 19 may be a conductive metal such as copper to assist in removing heat from the PV cells 6 to the surrounding water and a metallic heat spreader 25 may be attached to the rear of the PV cells. This enclosure may optionally be filled with a transparent liquid such as hydrocarbon oil for better cooling. The Fresnel Lens 3 should have its' grooved surface facing the PV cells to minimise dirt accumulation. The rear surface of the PV cells enclosure 6 is in contact with the water to provide cooling. The tube 19 is attached to the tracking tube 7 and lens 3 by struts 21 so that the whole assembly moves as one unit. The assembly should preferably be retained by a sliding ring looped around tube 7 which in turn is attached to a fixture or weight at the bottom of the pond by a rope or elastic cord, which may also carry the power output wires. One or more vanes may be attached radially outward from tube 7 in the vicinity of pump 8 to reduce oscillation of the system caused by wind or waves. Surface wave-breaking barriers 10 should be employed as referenced in FIG. 1. The water of the pond or reservoir need not be kept clean or filtered as it is not in long term contact with the optical surfaces of 3 and 20 and no water enters the optical path during operation except during extreme tilt. In this embodiment a lesser degree of protection is provided to the system against wind forces than that of FIGS. 1 and 3, but there is a large reduction in energy losses as there is no passage of light through water in this embodiment, so that the power available per unit area of collector is higher. In addition this system generates more consistent power during each day than that of FIG. 1 since there is no reduction or spreading of energy by refraction through and reflection from a water surface. There is some loss of useful collection area when the concentrator edges enter the water, but the loss from this cause is a small percentage of the daily total energy production. When using a two-dimensional concentrator this embodiment is more tolerant of waves and ripples and less precise manufacturing methods may be required for the lens 3 than when implemented with a one dimensional concentrating lens.

According to the alternative embodiment of the present invention which is illustrated in plan view by reference to FIG. 6, the apparatus uses a reflective concave parabolic concentrator 3 combined with a smaller reflective convex secondary reflector 23 placed on axis just inside the focus position of reflector 3. Secondary reflector 23 has a focal length that diverges the solar rays sufficiently to bring them to a focus in the vicinity of the PV energy converter 6 through a window 20 at the centre of reflector 3. The PV cells 6 are mounted in a position such that they are always substantially submerged below the pond water level when the system is within about 60 degrees of vertical. The apparatus is only partially submerged so that concentrator 3 remains above the surface at most angles of operation. Conical tube 19 links PV cells 6 and window 20 to form a sealed enclosure which prevents water contamination of the PV cells. This enclosure may optionally be filled with a non-corrosive transparent liquid to improve heat removal from the cells 6. A metallic heat spreader 25 may be provided at the rear of 6 to better conduct heat to the surrounding water. The inner walls of 19 are preferably highly reflective internally to further concentrate the rays. As for FIG. 5, the system as shown may be a linear, one dimensional concentrator, or it may be a two dimensional concentrator and tracking system similar to that illustrated in FIG. 4 with the addition of a second tacking tube at right angles to 7. In the one dimensional case tube 19 becomes a trough extending out of the plane of the diagram. The apparatus floats on a pond containing wave suppressors, as for FIG. 5. Tracking tubes and pumps 8 and 9 operate as for FIG. 5, allowing sun tracking and full inversion of the apparatus to submerge the large reflector 3 for protection in severe winds. A few small holes are provided in 3 near 20 to allow drainage. A vane 24 is provided for each axis to reduce oscillation due to waves and wind forces. Vane 24 is a fan-shaped concertina arranged on slide-locking hinges at its' tip to fold out of the wind when it is in an exposed position (inverted). All components are rigidly mounted together to rotate as one unit. All large components are preferably made of thin plastics material. The apparatus is tethered to the pond bottom in a manner similar to that of FIG. 4. The advantages of this system over that of FIG. 5 are that only smooth surfaces are required in the concentrator so that it is more readily cleaned by water spray and that the reflector can be more economically made with high strength due to its' parabolic shape. In other respects the system of FIG. 6 is similar in performance to that of FIG. 5. The water of the pond or reservoir need not be kept clean or filtered as it is not in long term contact with the optical surfaces of 3 and 23 and no water enters the optical path during operation except briefly during extreme tilt, so dirt in the water is of little consequence. The embodiments of FIGS. 5 and 6 both require that the mass of the apparatus be balanced approximately around the centre of rotation 17. For ease of balance and a low wind profile it is necessary that the lens of FIG. 5 and the reflector of FIG. 6 be kept as close as feasible to the water surface. This requirement causes the edges of the concentrator devices 3 of FIGS. 5 and 6 to become partially immersed at the ends of the daily tracking cycle when the pointing direction is close to the horizon. Windbreaks may be employed above the water surface to reduce oscillation of these systems.

The bi-directional positive displacement pumps 8 and 9 shown in FIGS. 3, 4, 5 and 6 include an electric motor drive and either gear or vane or peristaltic pump, or they may be implemented in the form of pulsed pumps using solenoids to compress flexible chambers. Such pumps are well known so are not detailed here. These pumps need only be of very small size, power and capacity, typically moving one cubic centimeter per second. According to alternative preferred embodiments of the invention that are not illustrated in the drawings, the apparatus uses underwater concentrators that are in the form of refractive lenses, optionally in Fresnel, or segmented form. These preferably use transparent plastics materials which are located near the water surface to form one or more air filled voids under the water to focus light, and an energy converting device such as a strip of photovoltaic cells which is located below the lens at the focal point. These embodiments have the advantage that no metallic reflective layer is required, thus extending the potential lifetime of the device. In such embodiments the concentrator may be suspended under the water attached to a floating buoyancy tracking system as described for FIG. 3, so that there is no need for a substantial support structure mounted at the bottom of the pond, and no need to control the depth of the water precisely.

Yet further preferred embodiments of the invention which are not illustrated use holographic concentrators.

In any of the preferred embodiments described, the photovoltaic cell energy converter 6 can be replaced either by a chemical reaction chamber optionally containing a catalyst, or by a thermoelectric energy converter The present invention allows the use of very low-cost materials for the reflector assemblies 3 of FIGS. 1 and 3 and 4 and 5 and 6. Any apparent loss in overall efficiency due to transmission losses through the water or other liquid is counter-balanced by providing larger reflector assemblies 3 than would be used if the same photovoltaic cells were used in a land-based collector assembly. This increase in size of reflector assembly (or lens assembly) results in a higher incident light energy density at the photovoltaic cells. Increasing the incident energy intensity on photovoltaic cells would normally lead to increased heating of the cells, which is undesirable for a number of reasons. One of these is that the efficiency of energy conversion of photovoltaic cells drops off as their temperature increases. However, having the photovoltaic cells within water provides natural convective cooling, allowing operation of the cells at 50 times or more of the intensity of normal sunlight with only a small temperature increase on the cells.

Placing the apparatus underwater also provides some protection against ultraviolet light, because wavelengths below 250 nanometers are filtered out of the light by passage through water (if over about 500 mm path). This protection from ultraviolet light allows relatively long term use of cheaper forms of plastics materials, which would otherwise not be suitable when exposed to the sun.

The apparatus is placed in this situation underwater, or partially underwater, to achieve five main objectives, which are:

1. Underwater placement reduces the disturbing effects of wind on the focusing collector. These effects include distortion of the structure by wind forces, which reduces the degree of concentration possible. These effects also include disturbances to the rotary tracking movements caused by wind forces.
2. Underwater placement greatly simplifies the requirements for a tracking mechanism to keep the concentrator and collector focused on the incoming radiation in that only changes in relative angular (or lateral) buoyancy are required to create precise and stable rotational movements. Tracking on any horizontal axis can be achieved simply by moving a mass of water from a partially filled, vertically extended buoyancy tank on one side to similar tank on the opposite side (changing the relative buoyancy in a closed system). Tracking about a vertical axis, if required, can be achieved with small propeller driven thrusters placed tangentially at the edges of the concentrator.
3. The placement of the energy converter underwater also provides efficient convective cooling of the energy-collecting device when required, especially when this collector is a set of PV cells or thermoelectric converters (whose rear, cold junction requires cooling). Both these energy collectors/converters operate with greater efficiency when cooled, especially if cooled below daytime ambient temperature, which is generally the case when the cells are in a large body of open water.
4. The underwater situation provides structural components with support via their buoyancy in water and reduces deflections caused by wind so that components of much lower mass, strength and cost may be utilized relative to such a concentrator used in an exposed position.
5. A permanent underwater location during operation greatly reduces all weather-related damage risk, including that from hail and wind at all times with no active control or power required. Such a system is passively robust.

It is believed that the use of lightweight materials will, in turn, reduce the costs of transport of materials to their site of installation and the handling costs associated with installation.

This invention is well suited to application in a hydroelectric pumped-storage system consisting of two dams at different altitudes with a motor-generator linked to a turbine in a tube between the two dams. The floating solar electric generators can supply energy to lift water from the lower dam to the upper dam when sunlight is available thus storing the energy. The floating solar collectors can cover most of the dam surface and can be arranged to have no contact with the bottom of the dam, using above-water tethers and wiring if needed to allow adaptation to widely varying water levels. The use of existing dams and reservoirs for solar energy collection, utilising the present invention, eliminates a large fraction of the usual site and set-up costs of a solar power plant.

The invention claimed is:

1. A collector for the collection of solar radiation, which collector includes:
   a. a tracking mechanism to keep the collector pointing at the sun;
   b. at least one energy conversion device for the conversion of electromagnetic energy into either electrical energy or chemical energy; and
   c. at least one concentration device for the reception of electromagnetic energy and the concentration of the electromagnetic energy onto the energy conversion device,
   wherein
   (1) the energy conversion device is substantially immersed in liquid during its operation,
   (2) the concentration device is at least partially immersed in liquid during part of the daily operation cycle while collecting solar energy, (3) the tracking mechanism is at least partially immersed in liquid during its operation, and (4) the energy conversion device, concentration device, and tracking mechanism are immersed within the same body of liquid.

2. A collector as claimed in claim 1, in which the liquid is substantially transparent to visible light.

3. A collector as claimed in claim 1, in which the liquid is water.

4. A collector as claimed in claim 1, in which the liquid is a hydrocarbon.

5. A collector as claimed in claim 1, in which the conversion device includes at least one of:
   a. a photovoltaic cell,
   b. a chemical reaction chamber exposed to the concentrated electromagnetic energy, and
   c. a thermoelectric converter.

6. A collector as claimed in claim 1, in which the energy conversion device is encased in a hermetic seal.

7. A collector as claimed in claim 1, in which the concentration device includes at least one of:
   a. a mirror, and
   b. a refractive lens.

8. A collector as claimed in claim 1 wherein the tracking mechanism includes motor-driven mechanical linkages.

9. A collector as claimed in claim 1 wherein the tracking mechanism includes lateral buoyancy tanks having adjustable buoyancy relative to each other.

10. A collector as claimed in claim 9 wherein each of the lateral buoyancy tanks extend vertically above the surface of the liquid and are interconnected at their highest portion by a passage.

11. A collector as claimed in claim 9 wherein the lateral buoyancy tanks are interconnected at their lowest portion by a passage, with a reversible positive displacement pump positioned in said passage to transfer liquid from one tank to the other to thereby alter the balance and thus tilt the collector in the desired direction.

12. A collector as defined in claim 1 wherein the tracking mechanism is controlled by a servo mechanism fed by right and left light sensors mounted on each side of a vertical vane and aligned with the vertical axis of the system.

13. A collector as claimed in claim 1 wherein a liquid-to-atmosphere interface is situated along the path of light traveling to reach the concentration device.

14. A collector as claimed in claim 13 further including means to inhibit the formation of waves at the interface between the body of liquid and the atmosphere, wherein the means for inhibiting the formation of waves is substantially transparent to the solar radiation.

15. A collector as claimed in claim 13 further including means to inhibit the formation of waves at the interface between the body of liquid and the atmosphere, wherein the means for inhibiting the formation of waves includes a floating barrier or a floating membrane.

16. A collector as defined in claim 13 further including means to inhibit the formation of waves at the interface between the body of liquid and the atmosphere, wherein the means for inhibiting the formation of waves includes a fixed barrier.

17. A collector as defined in claim 13 further including means to inhibit the formation of waves at the interface between the body of liquid and the atmosphere, wherein a plurality of such means for inhibiting the formation of waves is provided, each of which is regularly spaced.

18. A collector as claimed in claim 1, in which the liquid includes a component to suppress the growth of algae.

19. A collector for the collection of solar radiation comprising:

a. an energy conversion device including one or more of:
      (1) a photovoltaic cell,
      (2) a chemical reaction chamber, and
      (3) a thermoelectric converter,
      wherein electromagnetic light energy is converted to electrical or chemical energy, the energy conversion device being substantially immersed in a body of liquid during such conversion;
   b. an energy concentration device including one or more of:
      (1) a mirror, and
      (2) a lens,
      situated to concentrate electromagnetic light energy onto the energy conversion device, the energy concentration device being at least partially immersed in the body of liquid while the energy conversion device converts electromagnetic light energy to electrical or chemical energy;
   c. mechanical linkages reorienting the collector with respect to the sung the mechanical linkages being at least partially immersed in the body of liquid while the energy conversion device converts electromagnetic light energy to electrical or chemical energy.

20. A collector for the collection of solar radiation comprising:
   a. an energy conversion device including one or more of:
      (1) a photovoltaic cell,
      (2) a chemical reaction chamber, and
      (3) a thermoelectric converter,
      wherein electromagnetic light energy is converted to electrical or chemical energy;
   b. an energy concentration device including one or more of:
      (1) a mirror, and
      (2) a lens,
      situated to concentrate electromagnetic light energy onto the energy conversion device;
   c. a tracking mechanism including:
      (1) a tank mounted in connection with the energy concentration device, the tank tilting the energy concentration device when liquid is supplied to or removed from the tank;
      (2) a pump in communication with the tank, the pump serving to supply liquid to, or remove liquid from, the tank,
      wherein each of the energy conversion device, energy concentration device, and tracking mechanism is at least partially submerged in a body of liquid.

21. A collector as claimed in claim 1, wherein at least a major portion of each of the:
   a. tracking mechanism, and
   b. concentration device,
   is immersed in the body of liquid during operation.

22. A collector as claimed in claim 1, wherein at least a major portion of the surface area of the:
   a. tracking mechanism,
   b. energy conversion device, and
   c. concentration device,
   is immersed in the body of liquid during operation.

23. A collector as claimed in claim 20, wherein at least a major portion of each of the:
   a. tracking mechanism, and
   b. concentration device,
   is immersed in the body of liquid during operation.

24. A collector as claimed in claim 20, wherein at least a major portion of the surface area of the:
   a. tracking mechanism,
   b. energy conversion device, and
   c. concentration device,
   is immersed in the body of liquid during operation.

* * * * *